United States Patent [19]
Gill et al.

[11] Patent Number: 5,365,082
[45] Date of Patent: Nov. 15, 1994

[54] MOSFET CELL ARRAY

[75] Inventors: Manzur Gill, Arcola; Pradeep L. Shah, Dallas; Dave J. McElroy, Allen, all of Tex.

[73] Assignee: Texas Instruments Incorporated, Dallas, Tex.

[21] Appl. No.: 954,223

[22] Filed: Sep. 30, 1992

[51] Int. Cl.[5] .................. H01L 27/12; H01L 21/302
[52] U.S. Cl. ..................... 257/374; 257/398; 257/519; 257/648; 257/774; 257/775; 437/62; 437/63; 437/69; 437/72; 437/235; 437/978
[58] Field of Search ............ 257/374, 398, 519, 774, 257/775, 648; 437/62, 63, 69, 72, 235, 978

[56] References Cited

U.S. PATENT DOCUMENTS

| | | | |
|---|---|---|---|
| 4,502,210 | 3/1985 | Okumura et al. | 257/774 |
| 5,023,690 | 6/1991 | Verret et al. | 257/374 |
| 5,081,517 | 1/1992 | Contiero et al. | 257/648 |
| 5,091,768 | 2/1992 | Yamazaki | 257/774 |
| 5,160,996 | 11/1992 | Odanaka | 257/374 |

Primary Examiner—Edward Wojciechowicz
Attorney, Agent, or Firm—Ann Livington; Leo N. Heiting; Richard L. Donaldson

[57] ABSTRACT

A CMOS memory cell array, and a process for making it, that avoids problems caused by LOCOS isolation of cells. Moats are formed by etching away columns of a thick field oxide layer. The moats have two-tiered sidewalls, such that an upper tier is sloped, and a lower tier is more vertical. This approach provides the advantages of sloped sidewalls, but avoids filament problems. After the moats are formed, subsequent fabrication steps may be in accordance with conventional fabrication techniques for CMOS arrays.

20 Claims, 5 Drawing Sheets

MOSFET CELL ARRAY

TECHNICAL FIELD OF THE INVENTION

This invention relates to electronic semiconductor devices, and more particularly to a CMOS memory cell array that avoids undesired effects of field-oxide isolation regions with rounded corners.

BACKGROUND OF THE INVENTION

Field isolation regions are used in integrated circuit memory arrays to isolate memory cells from each other. EPROMS (erasable and programmable memories) are a type of CMOS transistor array that requires field isolation. Most EPROMs being manufactured today have single-transistor memory cells. The transistor has a double-poly gate structure, or "stack" in which an upper poly forms the control gate and wordlines and a lower poly forms a floating gate. Field oxide (FOX) regions are used to provide desired capacitive coupling between these gates, as well as to isolate adjacent cells.

FIG. 1A illustrates the FOX regions of a portion of a conventional single-transistor memory cell array. A particular example of such an array is an EEPROM (electrically erasable and programmable memory). In conventional fabrication, a "moat mask" defines the active areas, including source lines that run parallel to rows of cells and connect transistor source regions. The FOX regions are grown by a localized field oxidation (LOCOS) process in areas not protected by the moat mask. They form a pattern of "islands", each designed to have a sideways "H" shape. Cells having this pattern of FOX regions are sometimes referred to as "H cells". They are also sometimes referred to as "T cells" because the active areas are T-shaped.

Despite the straight-edged design of the FOX regions, after fabrication, their actual shape resembles a "dog bone", as illustrated by the dotted lines The FOX regions are rounded instead of square. This rounding occurs as a result of limitations of photolithography optical resolution and a different oxidation rate at corner areas.

Cell designs for other types of CMOS memory devices have similar problems with rounded field oxide region corners. FIG. 1B illustrates another such design, commonly known as the "X cell" design because its moat areas have the pattern of crossed lines throughout the array. Transistor gates are connected as wordlines. The dotted lines indicate the corner rounding that occurs when these arrays are fabricated by conventional techniques.

The rounded ends of the FOX regions have undesirable effects, well known in the art of semiconductor fabrication. For example, in FIG. 1A, if misalignment occurs between the field oxide regions and transistor gates, the channel widths of two adjacent transistors across the source line may differ, and the channel widths may vary across the length of each transistor. If cells in two adjacent rows share a source line, as is the case in some memory array layouts such as flash EEPROMs having a "double poly" structure, the capacitive coupling ratio between the control gate and floating gate may vary from cell to cell across the source line. The result is unequal programming and erase characteristics, leading to bimodality distributions. The same problems would manifest in an X-cell array, only in this case, the problem would be quadmodal distributions in program and erase characteristics. An additional problem is that gate oxide near the interface of LOCOS/channel oxide is generally inferior to the channel oxide away from this interface. This is the result of oxide/nitride layers used to relieve stress during LOCOS.

An alternative to LOCOS methods for forming field oxidation regions is to initially form a thick oxide layer. Moats are then directly etched in this layer to form alternating columns of moats and field oxide regions. This process is known as a "direct moat etch." However, a problem with direct moat etching is that if the sidewalls are steep, the completed structure may contain poly filaments that lead to reliability problems.

A need exists for a structure and method of fabricating isolation regions for CMOS memory arrays that avoids (1) a LOCOS/channel interface, (2) field oxide regions with rounded corners, and (3) the problems of direct moat etching.

SUMMARY OF THE INVENTION

One aspect of the invention is a memory cell array fabricated on a semiconductor substrate, with columns of active areas in which CMOS cells are formed. These active area columns are often referred to as "moats". They are isolated from each other by field oxide regions. They are formed by a direct moat etch process that includes etching away strips from a thick field oxide layer grown on the substrate. Each moat has two-tiered sidewalls, with an upper tier being sloped and a lower tier being vertical or nearly vertical. The bottom of the moat is covered with a gate oxide. Subsequent layers over the field oxide regions and gate oxide comprise various transistor components and array connectors.

Another aspect of the invention is a method of fabricating a CMOS memory cell array on a semiconductor substrate, with alternating moat regions and field oxide regions along columns of the array. First, a thick oxide layer is grown on the substrate. Then, moats are etched along columns of the substrate. They are formed by removing the thick oxide material in areas in which the moats are located, such that the result is alternating moats and field oxide regions. At this stage, the moats have sloped sidewalls. Next, a thin oxide layer is grown over the moats and field isolation regions. Next, the thin oxide layer is etched along the bottom of each of the moats to form a gate channel in each moat. As a result of the etch, this gate channel has nearly vertical sidewalls, and defines an area where gate oxide will be grown. This structure removes the channel oxide away from the LOCOS/channel oxide interface.

In a first embodiment of the above method, the sloped sidewalls are formed by patterning and etching a resist layer to define the moats, such that the resist layer pattern has sloped sidewalls, and then etching said field oxide layer to replicate said sloped sidewalls. In a second embodiment, the sloped sidewalls are formed by patterning a resist layer to define the moats, then etching the resist layer and the field oxide layer to form the moats with vertical or nearly vertical moat sidewalls, then forming oxide sidewalls along these vertical or nearly vertical moat sidewalls.

A technical advantage of the invention is that field oxide regions are defined by directly etched moats, which avoids the problems associated with LOCOS techniques. The structure and method avoid the filament problems associated with vertical etching of moat sidewalls, yet permits a high quality gate oxide to be grown.

DETAILED DESCRIPTION OF THE INVENTION

The description herein is in terms of a memory cell array for a flash EEPROM (electrically erasable and programmable memory). The flash EEPROM is a CMOS device, which has active area "moats" that run down its columns to define active regions. However, the invention is not necessarily limited to flash EEPROMs; it could be used for any memory cell array having similarly oriented moats.

Figure 1A:
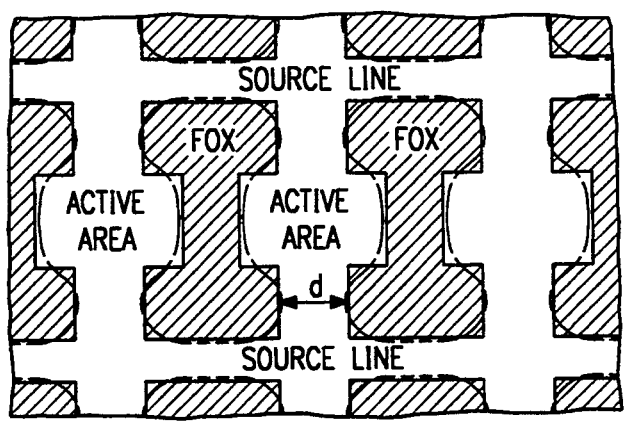
FIG. 1 illustrates the field oxide regions of a portion of a conventional EEPROM array.
Figure 1B:
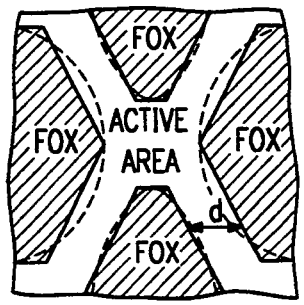
Figure 2C:
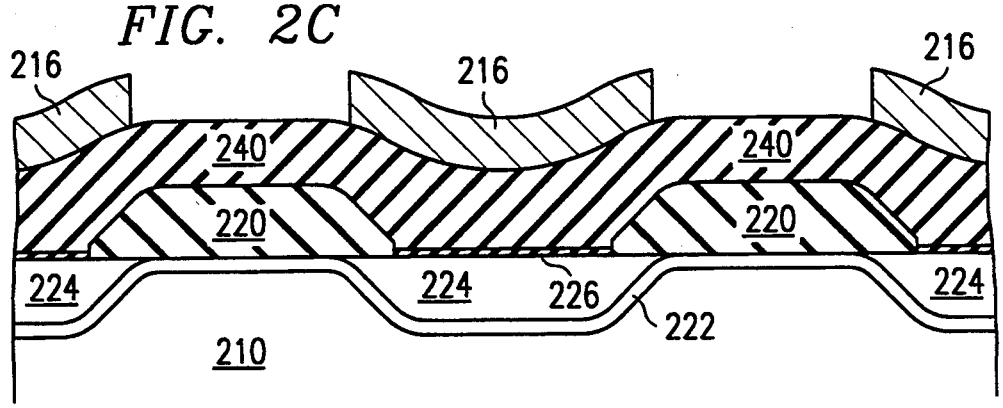
FIGS. 2A–2D are elevation views of a portion of an EEPROM memory cell array.
Figure 2D:
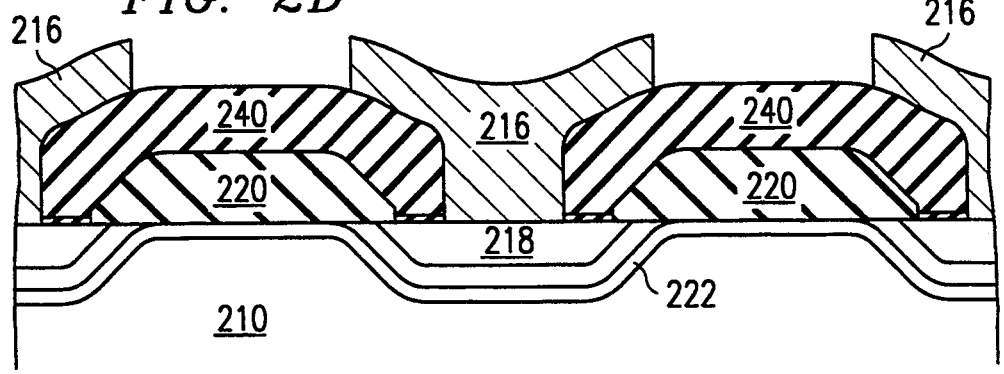
Figure 2A:
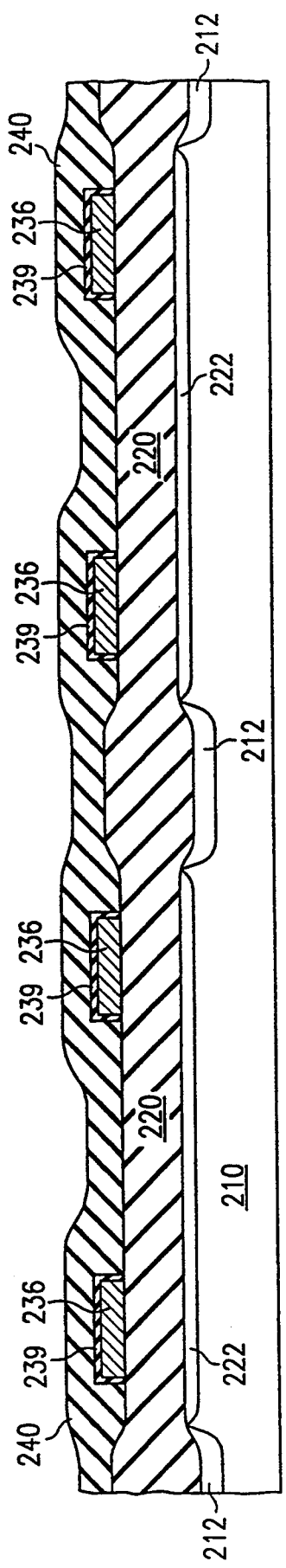
Figure 2B:
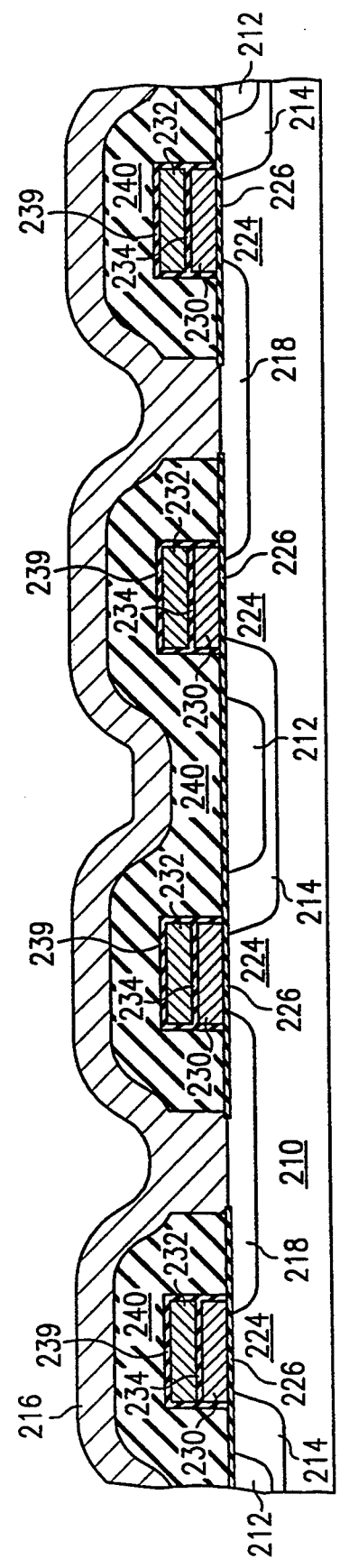
Figure 2E:
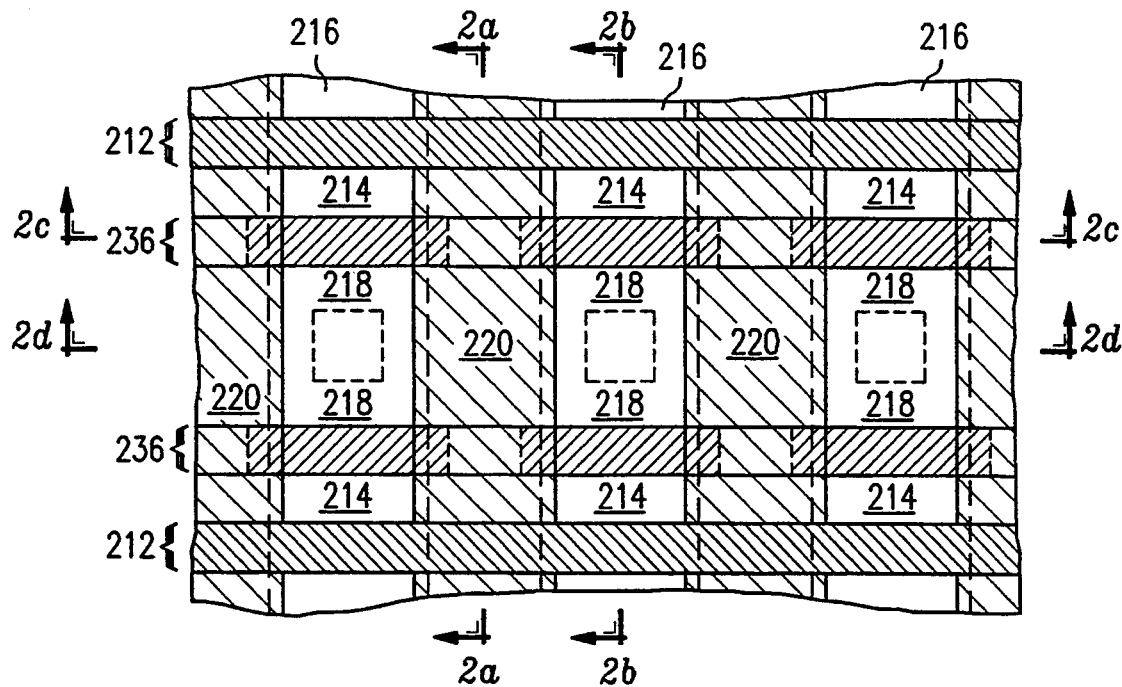
FIG. 2E is a plan view of the memory cell array of FIGS. 2A–2D.

FIGS. 2A–2D are elevation views of a portion of a flash EEPROM, taken along lines a—a, b—b, c—c, and d—d, respectively, of FIG. 2E, which is a plan view of the same device. As will be explained below, many of the features of FIGS. 2A–2D are the same of those of existing EEPROM arrays. However, an important feature of the invention is that the active areas are defined by etching away portions of a thick field oxide layer. They have a two-tiered sidewall, with an upper sidewall having a less steep slope than a lower sidewall. The lower sidewalls may be vertical, and define the area in which the transistor gates are formed. This two-tiered sidewall feature is illustrated in FIGS. 2C and 2D.

As an overview of the final structure of a flash EEPROM memory cell array, the cells are formed on the surface of a p-type silicon substrate 210. Source lines 212, which are n+ type, connect source regions 214 of the cells. Drain column lines 216 connect drain regions 218.

Cell-isolation thick-field oxide (FOX) regions 220 and channel stop regions 222 provide isolation between columns of cells. The channel region 224 is between source regions 214 and drain regions 218. A gate insulator layer 226 separates channel region 224 from floating gate 230.

Floating gate 230 is insulated from control gate 232 by an inter-level dielectric layer 234. At each memory cell, a wordline 236 becomes a control gate 232 above floating gate 230.

FIGS. 3A–3G illustrate one embodiment of the method of the invention, which is a method of fabricating an array of electrically erasable and programmable memory (EEPROM) cells. The method results in field oxide (FOX) regions 220 defined by a direct moat etching process, rather than made by growing of field oxide regions in a LOCOS process. It avoids the effects from the rounded ends of the FOX regions of prior art methods.

Figure 3A:
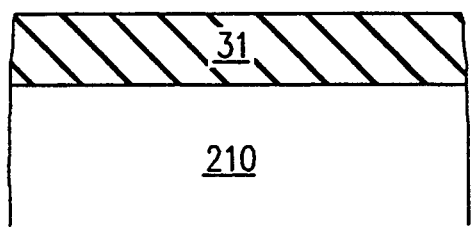
FIGS. 3A–3G' are cross section views of a moat area of a memory cell array, illustrating a process of fabricating them that includes a controlled resist etch to form a sloped moat sidewall.
Figure 3B:
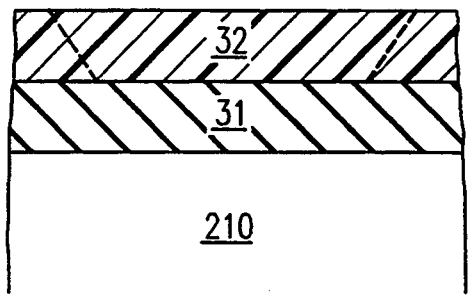
Figure 3C:
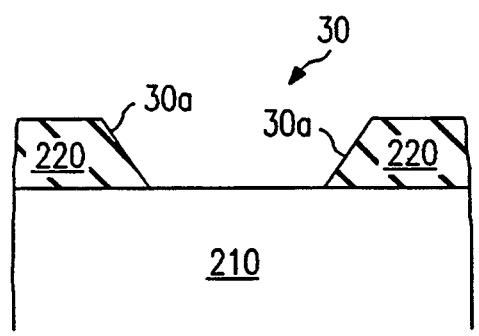
Figure 3D:
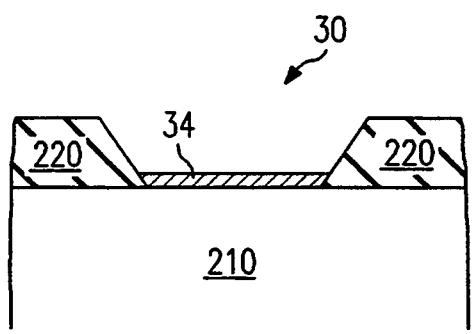
Figure 3E:
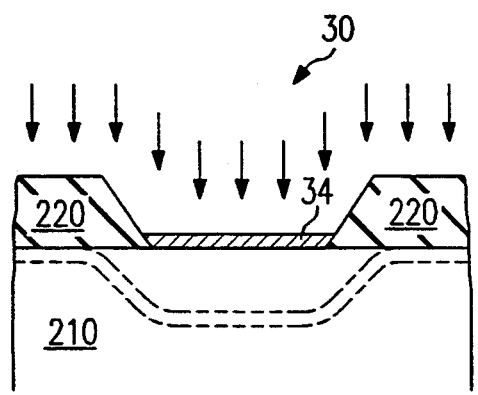
Figure 3F:
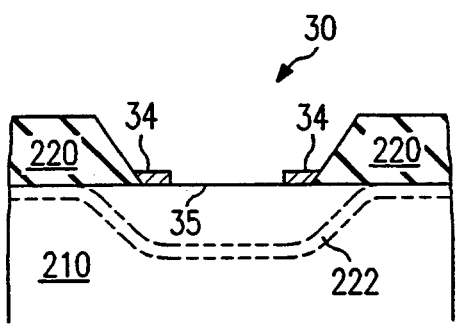
Figure 3F:
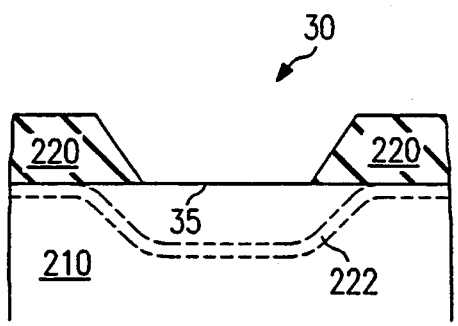
Figure 3G:
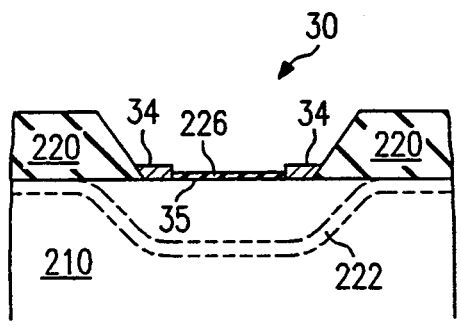
Figure 3G:
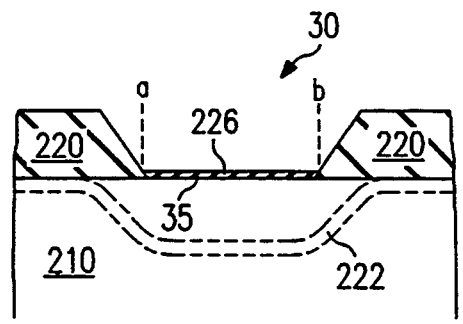

FIGS. 3A–3G are side views, during various stages of fabrication, of a "moat" 30, which defines an active area of a column of cells of an array. A memory cell array, such as that illustrated in FIGS. 2A–2E would have a number of moats corresponding to the number of columns of memory cells. FIG. 3G is essentially the same view of the moat as in FIGS. 2C and 2D, except that FIG. 3G does not show the subsequently added transistor elements and other layers. Conventional techniques are used unless otherwise stated herein. The figures, and their various layers and areas are not drawn to an absolute or relative scale, but are for purposes of illustration only.

In FIG. 3A, fabrication begins with a substrate 210 of a first conductivity type. For purposes of this description, this first conductivity type is p-type silicon. A second conductivity type used in subsequent steps for active regions is n-type. A thick oxide layer 31 is grown by conventional means. A typical CMOS array would have a thick oxide layer 31 with a thickness in the range of 5,000–10,000 angstroms.

In FIG. 3B, a resist layer 32 is deposited on the surface of the thick oxide layer 31, and exposed using conventional photomasking techniques. For reasons explained below, the exposure results in a tapered edge resist profile.

In FIG. 3C, a moat 30 is defined by etching away the field oxide layer 31 in areas not covered by the resist layer 32. As shown in FIGS. 2C and 2D, the remaining areas of field oxide layer 31 are the field oxide regions 220.

Various known etching techniques may be used to result in sidewalls of moat 30 that are downwardly sloped toward the bottom of moat 30. In general, the resist etch back process is selected so that the etch rate of resist and oxide is similar. This results in a tapered edge of thick oxide similar to that of the photoresist. In other words, the sloped sidewalls of moat 30 are the result of controlled resist erosion. The resist layer 31 is first exposed and developed so that it has tapered edges with the desired slope. Then, the selectivity of the etch process is adjusted so that the resist layer 32 and field oxide layer 31 are both etched at the same rate. In this manner, the slope of the walls formed in the resist layer 32 is replicated in the walls of the field oxide layer 31.

The etching continues until substrate 210 is exposed at the bottom of moat 30. For a typical CMOS array, the slope will be in the range of 20 to 80 degrees. As an example of a typical CMOS structure, the bottom of moat 30 is 1.2 micrometers in width. The moat formed as a result of this first etch is an "interim" moat in the sense that the lower portion of its sloped sidewalls will be subsequently replaced by vertical or nearly vertical sidewalls, as explained below.

In FIG. 3D, after a clean-up, a thin oxide layer 34 is grown. It covers the bottom and sidewalls of moat 30, as well as the field oxide regions 200. In a typical memory device, the thin oxide layer 34 is grown to a thickness ranging from 400–1000 angstroms. Very little oxide grows on the top surface of field oxide regions 220.

In FIG. 3E, an implant is performed to create a channel stop region 222. Where substrate 210 is p-type, the implant substance is typically boron. The implant is high-energy, such that the boron is implanted at the interface formed by thick oxide layer 31 and the silicon substrate 210, but is implanted below the interface formed by the thin oxide layer 34 and substrate 210. The penetration of the boron is indicated by the dotted lines of channel stop region 222. Referring again to FIGS. 2C and 2D, boron from the channel stop implant is located sufficiently below channel 224 such that it does not affect the operation of channel 224. At this stage, the cell threshold voltage may be adjusted with the boron implant having an energy in the range of 10 keV to 40 keV.

The formation of channel stop region 222, could also be performed after the etching step of FIG. 3C, prior to growing the thin oxide layer 35.

In FIG. 3F, the thin oxide layer 34 is etched, using a photoresist pattern, to form a channel 35 at the bottom of moat 30. This second moat-etching step does not require sloped sidewalls. They may be vertical or nearly vertical. Because the walls formed by this second etch have a height in the range of 400–1000 angstroms, the potential for poly filaments is reduced considerably, as compared to a longer and more vertical step. For purposes of example, a typical cell width, as measured across channel 35 is in the order of 0.6 micrometers, where the width of moat 30 at its bottom is 1.2 micrometers.

The moat 30 that is formed as a result of the steps of FIGS. 3A–3F has "two-tiered" sidewalls. The first tier is longer, and it is gently sloped to avoid filaments. The second tier is steeper, but is shorter so that filament problems are minimized. The steep-sidewalled part of moat 30 defines channel 35.

In FIG. 3F, a gate oxide layer 226 is grown at the bottom of the channel 35, between the remaining strips of thin oxide 34. For a typical CMOS flash EEPROM array, the thickness of the gate oxide layer 226 might be in the range of 80–150 angstroms.

A variation of the steps performed in FIGS. 3F and 3G is shown in FIG. 3F' and 3G'. In FIG. 3F', a blanket wet etch of the oxide layer 34 exposes "virgin" silicon on which the gate oxide layer 226 may be grown. The oxide layer 34 thus serves the purpose of removing silicon that may have been damaged during the first sidewall etch of FIG. 3B. In FIG. 3G', the gate oxide 226 is grown. This variation permits a reduction in cell size by reducing the width of channel 35, which is now defined by the field oxide/gate oxide edge at points a and b. The moat sidewall is sloped, although not two-tiered, because thin oxide layer 34 is entirely etched away.

FIGS. 4A–4D are an alternative method of forming isolated active area moats 30 in accordance with the invention. Like the process of FIGS. 3A–3G, moats 30 are formed by a direct etching process, which avoids steep and long sidewalls. The result is a two-tiered sidewall, but the "interim" moat is formed by growing sidewall oxide rather than by a first moat-etch.

Figure 4A:
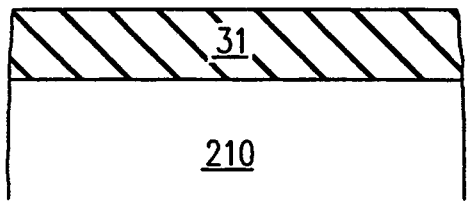
FIGS. 4A–4D are cross section views of a moat area of a memory cell array, illustrating a process of fabricating them that includes growing sidewall oxide to form a sloped moat sidewall.
Figure 4B:
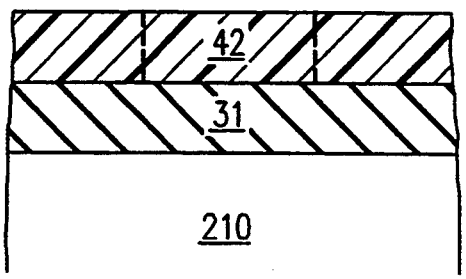

FIG. 4A, like FIG. 3A, illustrates that the process begins with a thick oxide layer 31 grown on a substrate 210. In FIG. 4B, as in FIG. 3B, a photoresist layer 42 is deposited and patterned, using conventional photoresist techniques. Like FIG. 3B, the photoresist pattern defines the boundaries between field isolation regions 220 and moats 30. As compared to FIG. 3B, however, photoresist layer 42 need not be tapered for providing sloped sidewalls during the subsequent etch.

Figure 4C:
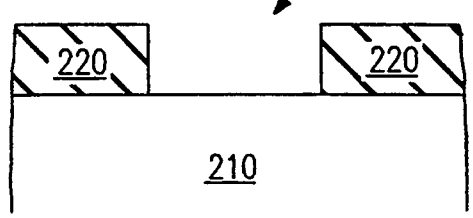

In FIG. 4C, the areas of field oxide layer 31 not covered by the photoresist pattern are etched away to form moats 30. The result is the formation of a moat 30, having vertical or nearly vertical sidewalls.

Figure 4D:
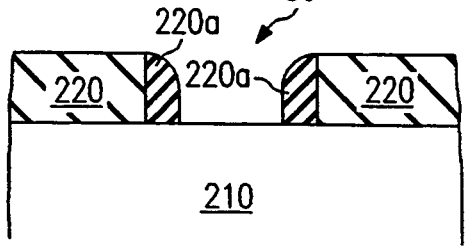

In FIG. 4D, oxide sidewalls 220a have been formed along the vertical sidewalls of moat 30. Oxide sidewalls 220a are formed by known techniques. In general, an oxide layer is deposited. This layer is then etched anisotropically, leaving sidewalls 220a.

The subsequent steps of forming moat 30 are the same as FIGS. 3D–3G. Thus, after sidewalls 220a are formed, a thin oxide layer 34 is grown as in FIG. 3D. An etch is performed to form channel 35, on whose bottom surface a gate oxide layer 226 is grown as in FIGS. 3E–3G.

After the field isolation regions 220 and the gate oxide 22b have been fabricated as described above, the fabrication process may be the same as for existing CMOS memory cell arrays. For EEPROM fabrication, U.S. patent Ser. No. 723,010 (Atty Docket No. TI-16342, entitled "EEPROM Cell Array With Tight Erase Distribution", which is incorporated herein by reference, describes how the gate stack, i.e., floating gate 230 and control gate 232, wordlines 236, and other components are fabricated.

The process of forming the floating-gate conductors is performed by depositing a layer of first-level polysilicon (poly-1) over substrate 210. The poly-1 layer is deposited to a thickness of about 1500–2500 angstroms. The layer is doped n-type with phosphorous and may be de-glazed, if needed. The poly-1 layer is patterned with photoresist to define insulated floating-gate strips, to define two edges of the floating gates 230. The photoresist covering the tops of the floating-gate strips is then removed.

After the floating-gate strip fabrication, an inter-level insulator layer such as oxide/nitride/oxide (ONO) of equivalent oxide (dielectric) thickness in the range of 200–400 angstroms is formed over and around the poly-1 strips by conventional techniques. A second-level polysilicon (poly-2) layer 2000–4500 angstroms thick is then deposited over the face of the substrate 210, highly doped n+ to make it conductive, then de-glazed. Photoresist is applied to define wordline stacks that include the poly-2 layer, the inter-level insulator layer, and the poly-1 layer that forms columnar floating-gate strips. Next, a stack-etch procedure is used to create the wordlines 236.

The next step is to implant, using a photoresist process on the source and drain side of each channel 224, the shared n+ sources 214 and shared n+ drains 218. An additional source implant may also be applied for a graded source junction. The stack-etched poly-1 and poly-2 strips form an implant mask covering the channel regions 224 between sources 214 and drains 218. An arsenic implant is performed at a dosage of about $5 \times 10^{15}$ cm$^{-2}$ at about 60–130 KeV to create the self-aligned n+ source regions 214 and self-aligned drain regions 218.

An oxide layer 239 is then grown over substrate 210, including over wordlines 236, drain regions 218 and source regions 214. Oxide layer 239, which is shown in FIG. 2D as being only over the poly-1 and poly-2 stack, enhances data retention. Next, after a planarizing oxide layer 240 is formed, contact and metallization processes are performed. Metal bitlines 216 run over and perpendicular to the wordlines 236 and the buried source lines 212. This is followed by protective dielectric formation.

As a result of the above described process, the CMOS array is distinctive in that its field oxide regions 220 are not submerged. Also, there is no gate oxide at the LOCOS/channel interface.

Other Embodiments

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. An array of memory cell transistors fabricated in rows and columns on a semiconductor substrate, comprising:
   thick field oxide regions on said substrate separating each said memory cell transistors in each said row from said memory cell transistor in adjacent said columns;
   an active area of said substrate between said thick field oxide regions and positioned at or below the level of lower surface of said thick field oxide regions on said substrate, for providing a fabrication base for said memory cell transistor components, each said active area defined by a two-tiered sidewall, of said field oxide region;
   said two-tiered sidewall having a sloped upper sidewall and a vertical or nearly vertical lower sidewall; and
   said memory cell transistors fabricated in said active areas of said substrate, each said memory cell transistor components including a gate, a drain, and a source.

2. The array of claim 1, and further comprising a channel stop region under said field oxide regions and the surface of said active areas of said substrate.

3. The array of claim 1, and further comprising a thin oxide layer covering said active areas of said substrate.

4. The array of claim 3, and further comprising a channel under said thin oxide layer covering said active areas of said substrate.

5. The array of claim 1, wherein a said gate of said memory cell transistor is fabricated over a gate oxide layer grown on each said active area of said substrate.

6. The array of claim 1, wherein said upper sidewall is formed by means of a resist pattern with tapered edges and a controlled etch of a layer of field oxide to form said field oxide region.

7. The array of claim 1, wherein said upper sidewall is formed by a direct etch of a layer of field oxide to form said field oxide region followed by fabrication of a sidewall oxide.

8. A array having rows and columns of transistor cells formed on a semiconductor substrate, made by a process that uses direct moat etching, comprising:
   a thick field oxide region separating each said transistor cell in a row from a transistor in an adjacent column, said thick field oxide region made by growing a layer of thick field oxide on said substrate and etching through said layer of thick field oxide to said substrate to form active areas on said substrate, said active areas at or below the level of the lower surface of said layer of thick field oxide, wherein each said active area is defined by sloped sidewalls of said thick field oxide regions, growing a thin oxide layer over said active area, and then etching a channel having vertical or nearly vertical walls through said thin oxide layer over said active area; and
   said transistor cells fabricated in said active areas, each said transistor cell having at least a gate, a drain, and a source.

9. The memory array of claim 8, wherein said sloped sidewalls are made by patterning and etching a resist layer to define said active areas, such that the resist layer pattern has tapered edges, and then etching said layer of thick field oxide to replicate said tapered edges.

10. The memory array of claim 8, wherein said sloped sidewalls are made by patterning a resist layer to define said active areas, then etching said resist layer and said layer of thick field oxide to form said active areas with vertical or nearly vertical sidewalls of said thick field oxide regions, then forming oxide sidewalls along said vertical or nearly vertical sidewalls of said thick field oxide regions.

11. The memory array of claim 8, and further comprising a channel stop region under said field oxide regions and said active areas.

12. The memory cell array of claim 8, wherein said transistor cells are configured as memory cells for a flash-type electrically programmable and erasable memory cell array.

13. A method of fabricating a memory array on a semiconductor substrate, with alternating active areas and field isolation regions, comprising the steps of:
   growing a thick oxide layer on the substrate;
   fabricating rows and columns of active areas on said substrate, said active areas formed by removing said thick oxide layer in areas in which said active areas are located, such that the result is alternating active areas and field isolation regions, wherein said active areas on said substrate are defined by sloped sidewalls of said field isolation regions and wherein said active areas are at or below the level of the lower surface of said field isolation regions;
   growing a thin oxide layer over said active areas; and
   etching said thin oxide layer to form a channel in each said active area, said channel defined by vertical or nearly vertical sidewalls in said thin oxide layer.

14. The method of claim 13, wherein said step of fabricating said active areas comprises patterning and etching a resist layer on said thick oxide layer to define said active areas, such that the resist layer pattern has tapered edges, and then etching said thick oxide layer to replicate said tapered edges.

15. The method of claim 13, wherein said step of fabricating said active areas comprises patterning a resist layer on said thick oxide layer to define said active areas, then etching said resist layer and said thick oxide layer to form said active areas with vertical or nearly vertical sidewalls of said field isolation regions, then forming oxide sidewalls along said vertical or nearly vertical sidewalls of said field isolation regions.

16. The method of claim 13, and further comprising the step of implanting boron to form a channel stop region under said field oxide regions and said active regions.

17. The method of claim 16, wherein said implanting step is performed after said step of fabricating said active areas and before said step of depositing said thin oxide layer.

18. The method of claim 16, wherein said implanting step is performed after said step of depositing said thin oxide layer.

19. The method of claim 13, and further comprising the step of growing a gate oxide layer over said channel.

20. The method of claim 13, wherein said step of etching said thin oxide layer completely removes said thin oxide layer.

* * * * *